United States Patent
Onoguchi et al.

(10) Patent No.: US 8,669,534 B2
(45) Date of Patent: Mar. 11, 2014

(54) ELECTROSTATIC LENS FOR CHARGED PARTICLE RADIATION

(75) Inventors: Akira Onoguchi, Chofu (JP); Kyoko Onoguchi, legal representative, Chofu (JP); Kenichi Obori, Kyoto (JP); Koichi Matsumoto, Kyoto (JP); Shogo Awata, Kyoto (JP); Satoshi Ohashi, Kyoto (JP)

(73) Assignee: Horiba, Ltd. (JP)

( * ) Notice: Subject to any disclaimer, the term of this patent is extended or adjusted under 35 U.S.C. 154(b) by 686 days.

(21) Appl. No.: 12/934,966

(22) PCT Filed: Mar. 23, 2009

(86) PCT No.: PCT/JP2009/055665
§ 371 (c)(1), (2), (4) Date: Feb. 22, 2011

(87) PCT Pub. No.: WO2009/119504
PCT Pub. Date: Oct. 1, 2009

(65) Prior Publication Data
US 2013/0009070 A1  Jan. 10, 2013

(30) Foreign Application Priority Data
Mar. 26, 2008  (JP) .................................. 2008-082084

(51) Int. Cl.
*H01J 37/12* (2006.01)

(52) U.S. Cl.
CPC ..................................... *H01J 37/12* (2013.01)
USPC ..................................................... 250/396 R

(58) Field of Classification Search
CPC ........................................................ H01J 37/12
USPC ..................................................... 250/396 R
See application file for complete search history.

(56) References Cited

U.S. PATENT DOCUMENTS

| 3,286,187 | A | * | 11/1966 | Gabor | .......................... 313/361.1 |
| 5,254,856 | A | * | 10/1993 | Matsui et al. | ...................... 850/9 |
| 2003/0006377 | A1 | * | 1/2003 | Nomura | .................... 250/396 R |

FOREIGN PATENT DOCUMENTS

| JP | 10-241616 A | 9/1998 |
| JP | 11-329321 A | 11/1999 |
| JP | 2000-340152 A | 12/2000 |

OTHER PUBLICATIONS

International Search report for International Application No. PCT/JP2009/055665 mailed Jun. 9, 2009 with English translation.

\* cited by examiner

*Primary Examiner* — Jack Berman
(74) *Attorney, Agent, or Firm* — Cantor Colburn LLP (57) ABSTRACT

Provided is an electrostatic lens for charged particle radiation with a lens performance relatively comparable to that of a magnetic type lens. A plurality of electrodes arranged on the incident side of charged particles form a first electric field area, wherein orbit radii of the charged particles are reduced without exceeding, on the way, the initial orbit radii that are orbit radii at the incident time, and a second electric field area, wherein force in the direction advancing in parallel with a central axis is applied to the charged particles that have passed through the first electric field area. A plurality of electrodes arranged on the projection side form a third electric field area, wherein the orbit radii of the charged particles do not exceed the initial orbit radii on the way and are curved to intersect with a central axis at angles larger than orbit angles defined with respect to the central axis of when the charged particles are projected from the second electric field area.

11 Claims, 13 Drawing Sheets

ELECTROSTATIC LENS FOR CHARGED PARTICLE RADIATION

CROSS REFERENCE TO RELATED APPLICATIONS

This is a U.S. national stage application of International Application No. PCT/JP2009/055665, filed on 23 Mar. 2009. Priority under 35 U.S.C. §119(a) and 35 U.S.C. §365(b) is claimed from Japanese Application No. JP2008-082084, filed 26 Mar. 2008, the disclosure of which is also incorporated herein by reference.

FIELD OF THE INVENTION

The present invention relates to an electrostatic lens for convergence of charged particles properly used in a SEM, an ion gun and the like.

BACKGROUND ART

Conventionally, as an electron lens for use in, e.g., a SEM and an ion gun, there are known a magnetic lens and an electrostatic lens as disclosed in Patent Literatures 1 and 2. In the former magnetic lens, although an aberration can be reduced, it is very difficult to reduce a size and weight due to a limitation in shape of a magnetic pole. Meanwhile, although the latter electrostatic lens holds superiority in reducing the size and weight, it is difficult to reduce an aberration in a deceleration type and it is necessary to apply a high voltage to an electrode in an acceleration type, and therefore a pressure-resistant design thereof is not easy.

For example, in the case of a unipotential electrostatic lens of a conventional three-electrode deceleration type, if a lens design is performed as to have a minimum spherical aberration coefficient $C_S$, chromatic aberration coefficient $C_C$ and the like with respect to a focal length F, $C_S=7.1\times F$ is obtained. And assuming that an electron accelerating voltage $V_A=5$ kV, a focal length F=5 mm, a radius r=4.54 mm of each through aperture in FIG. 9 and an inter-electrode distance s=an inter-mediate electrode thickness t=2.27 mm, $C_S=35.54$ mm is obtained with a lens electrode voltage −8250V.

Compared this value ($C_S=35.54$ mm) to $C_S=4.3$ mm of a magnetic type lens of a strong magnetization with a bore size of 10 mm, an inter-pole gap of 5 mm and an identical focal length, the spherical aberration coefficient of the deceleration type electrostatic lens becomes approximately 8.3 times the spherical aberration coefficient of the magnetic type lens.

Figure 9:
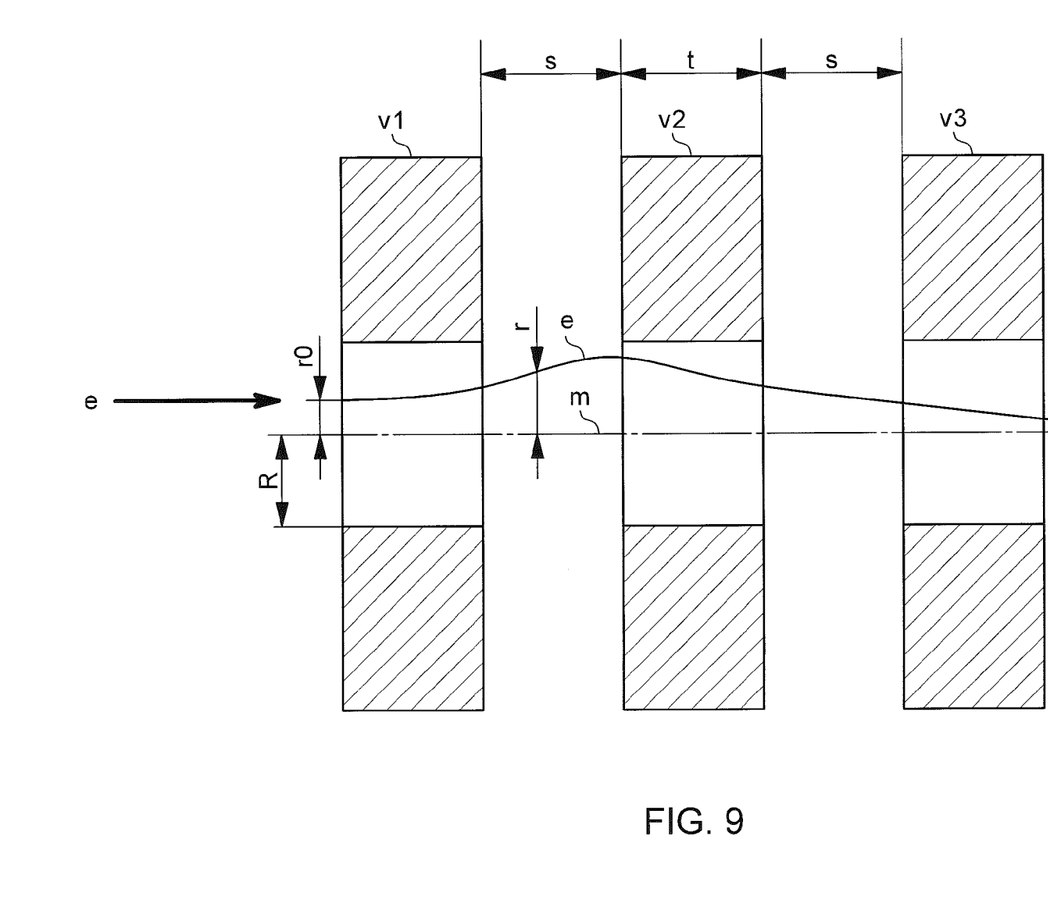
FIG. 9 is a model configuration sectional view of a conventional deceleration type electrostatic lens.

The reason why the spherical aberration coefficient of the deceleration type electrostatic lens becomes large like this is because, when electrons incident in parallel with a central axis keeping a distance r0 therefrom sequentially pass through an incident side electrode V1, an intermediate electrode V2 and a projection side electrode V3, the electrons are affected by these electrodes (forces of electric fields) and advance in a direction apart from a central axis m in an interval between the incident side electrode V1 and the intermediate electrode V2, and after a separation distance r from the central axis m becomes maximum, the electrons converge while tracing an orbit like a mountain in a manner of proceeding toward or intersecting with the central axis m. This is also understood from the fact that the spherical aberration coefficient $C_S$ becomes large as r becomes large in a calculation equation of the spherical aberration coefficient $C_S$ as defined by Equation (1) as following:

[Equation 1]

$$C_S = \frac{F^4}{64}\int_a^b V_Z^{\frac{1}{2}}\left[\left\{3\left(\frac{V_Z'}{V_Z}\right)^4 - 4.5\left(\frac{V_Z'}{V_Z}\right)^2\cdot\left(\frac{V_Z'}{V_Z}\right)' + 5\left(\frac{V_Z'}{V_Z}\right)'^2\right\}r^4 + 4\frac{V_Z'}{V_Z}\left(\frac{V_Z'}{V_Z}\right)'r^3\cdot r'\right]dz \qquad (1)$$

Herein, F is a focal length, z is a distance on the central axis, Vz is a potential on the central axis, Vz' is a differentiation value of Vz with respect to z, a symbol ' is differentiation with respect to z, r is a distance from the charged particle radiation to the central axis and is a function of z, and r' is a differentiation value of r with respect to z.

Patent Literature 1: JP-A-Heisei 10-241616
Patent Literature 2: JP2000-340152A

DISCLOSURE OF THE INVENTION

Problems to be Solved by the Invention

However, in the conventional deceleration type electrostatic lens, the spherical aberration coefficient thereof is approximately 8.3 times the spherical aberration coefficient of the magnetic type lens as described above, and there cannot be obtained a lens performance comparable to that of the magnetic type lens.

Meanwhile, if an acceleration type electrostatic lens is used with a voltage applied to the intermediate electrode as a positive voltage, the spherical aberration coefficient of the lens can be reduced with its orbit being as an orbit that converges while the distance to the central axis is gradually decreased over a whole range of the lens, but, in order to obtain such a characteristic, there is involved a problem of exceeding a practical range such that, in the case of focusing electrons of, e.g., 50 kV, it is necessary to apply a voltage (500 kV) of nearly ten times thereof to the intermediate electrode.

In consideration of the problems mentioned above, the present invention has been made for the first time as a result of the inventor's earnest study that, while paying attention to an orbit of charged particles, the control thereof is very effective in reducing a spherical aberration coefficient of a lens and an application voltage, and an essentially intended subject thereof is to provide an electrostatic lens for charged particle radiation that is practicable also as an objective lens and the like by solving the problems of the aberration performance and the application voltage, making full use of its properties of compacting in size and reduction in weight as advantages of an electrostatic lens, which in turn is to realize a device such as a SEM of a reduced size and weight including the lens as an objective lens.

Means Adapted to Solve the Problems

That is, an electrostatic lens for charged particle radiation according to the present invention is provided with a plurality of electrodes arranged on a central axis, and among the plurality of electrodes, a plurality of electrodes arranged on an incident side of charged particles form a first electric field area which reduces an orbit radius of the charged particles without exceeding, on the way, an initial orbit radius that is an orbit radius at an incident time of the charged particles and form a second electric field area which applies a force in a direction advancing in parallel with the central axis to the charged particles that have passed through the first electric field area, and among the plurality of electrodes, a plurality of electrodes arranged on a projection side form a third electric field area which keeps the orbit radius of the charged particles from exceeding the initial orbit radius on the way and curves the orbits of the charged particles to intersect with the central axis at angles larger than orbit angles of the charged particles defined with respect to the central axis at a time of being projected from the second electric field area.

With this configuration, since the charged particles trace the orbits so as not to exceed the distance from the central axis at the initial incident time of the charged particles to this electrostatic lens, r in Equation (1) mentioned above is prevented from increasing, whereby the spherical aberration coefficient $C_S$ can be prevented from increasing. Moreover, since the charged particles intersect with the central axis at larger angles by the third electric field area and are focused, a lens center (an intersection point of a line extending in an advancing direction of the charged particles at the incident time and a tangent of the charged particle radiation at a focal point) can be moved to a side of the focal point, whereby the focal length that is a distance between the lens center and the focal point can be reduced. Thus, if the focal length is reduced, the focal length F in Equation (1) mentioned above can be reduced and, also in view of this point, the spherical aberration coefficient $C_S$ can be reduced, thereby contributing to improvement of resolution. Further, if the spherical aberration coefficient is reduced, the lens performance can be improved such that a chromatic aberration coefficient per se is reduced. These effects are especially remarkable in the case of constituting a deceleration type electrostatic lens to be described later, and whereas in the case of constituting an acceleration type electrostatic lens, an effect of reducing an application voltage becomes remarkable, which makes it possible to largely promote the acceleration type lens to be in actual use. With these effects, it becomes possible to adapt the electrostatic lens for the charged particle radiation according to the present invention to an objective lens and the like, which in turn makes it possible to realize a device such as a SEM of very compact size and light weight.

In specific, in a deceleration type one, it is preferable to have a configuration such that the charged particles incident in parallel with the central axis are advanced generally in parallel with the central axis in the second electric field area.

As a desirable aspect of the present invention, there can be exemplified a configuration such that the orbit radius of the charged particles in the second electric field area is approximately 45% to 60% of the initial orbit radius. This is because, if smaller than 45%, it becomes difficult to come into a focus at a desired position, and if exceeding 60%, the effect of reducing the aberration cannot be obtained so much.

As a set parameter for obtaining a desired electric field area, a shape of each electrode, a distance between electrodes and an application voltage to each of the electrodes can be listed.

As a desirable aspect in the case of adapting the present invention to a deceleration type electrostatic lens, an incident side electrode and a projection side electrode are arranged on both sides of an intermediate electrode wherein potentials of the incident side electrode and the projection side electrode are lower than that of the intermediate electrode to form a three-electrode deceleration type electrostatic lens, and an orbit control electrode of a high potential higher than that of the incident side electrode is arranged between the intermediate electrode and the incident side electrode. Thus, the first and second electric field areas may be formed by the incident side electrode and the orbit control electrode, and the third electric field area may be formed by the orbit control electrode, the intermediate electrode and the projection side electrode. In the case of setting the potentials of the incident side electrode and the projection side electrode to be equal, a deceleration type unipotential electrostatic lens is to be formed by adding the intermediate electrode to these electrodes.

If the orbit control electrode is so formed as to have a shape such that an inner peripheral end thereof has a large thickness larger than that of an outer peripheral side in a direction of the central axis and the intermediate electrode is so formed as to have a shape such that an inner peripheral end thereof has a thin thickness smaller than that of an outer peripheral side in a direction of the central axis, there is formed a paralleling electric field, i.e., the second electric field area, for paralleling the charged particle radiation to the central axis in a space within the inner peripheral end of the orbit control electrode, and yet since an electric field influence from the intermediate electrode onto the paralleling electric field can be reduced as soon as possible, it becomes possible to promote maximization of the second electric field area and efficient paralleling of the orbits of the charged particles associated therewith.

In order to accomplish a similar object, it may be also considered that a bore diameter of a charged particle through hole formed at a center of the orbit control electrode is made smaller than those of the other three electrodes.

In order to suppress the dispersion of the charged particles after passing through the second electric field area, it is preferable to arrange the orbit control electrode near to the incident side electrode than the intermediate position between the incident side electrode and the intermediate electrode. This is because a potential gradient caused between the orbit control electrode and the intermediate electrode can be made small so that the dispersion action can be reduced.

As the other devices for contributing to reduction of the dispersion action and the efficient production of the paralleling electric field, there is exemplified such as a way that the through hole of the incident side electrode is taper shaped to have its bore size being smaller on the incident side and larger on the projection side, or a way that the through hole of the projection side electrode is taper shaped to have its bore size being larger on the incident side and smaller on the projection side.

As a desirable aspect in the case of adapting the present invention to an acceleration type electrostatic lens, there can be exemplified a configuration such that, a first stage electrode and a second stage electrode of a high potential higher than that of the first stage electrode are arranged in the order from the incident side of the charged particles to thereby form the first electric field area and the second electric field area, and further rearward these first and second stage electrodes, an incident side electrode of a low potential lower than that of the second stage electrode, an intermediate electrode of a high potential higher than that of the incident side electrode and a projection side electrode of a low potential lower than that of the intermediate electrode are arranged in this order to thereby form a three-electrode acceleration type electrostatic lens, whereby the third electric field area is formed by the three electrode acceleration type electrostatic lens. In the case where the potentials of the incident side and projection side electrodes are set to be equal, an acceleration type unipotential electrostatic lens can be formed with the intermediate electrode added to these electrodes.

Effect of the Invention

According to the present inventions as constituted like this, since the orbits of the charged particles are traced so that the distance thereof from the central axis does not exceed (i.e., is made smaller than) the distance from the central axis at the initial incident time and also the focal length can be set to be small, the reduction in aberration and improvement in resolution of the lens or reduction in voltage can be expedited, and thus it becomes possible to provide a practical electrostatic lens for charged particle radiation with a lens performance relatively comparable to that of a magnetic type lens while achieving reduction in size and weight.

DESCRIPTION OF REFERENCE SYMBOLS

A . . . electrostatic lens for charged particle radiation (deceleration type electrostatic lens for electron radiation)
e . . . charged particle (electron)
h1 . . . passing-through hole of incident side electrode
h2 . . . passing-through hole of intermediate electrode
h3 . . . passing-through hole of projection side electrode
h4 . . . passing-through hole of orbit control electrode
m . . . central axis
n . . . intermediate position between incident side electrode and intermediate electrode
r . . . orbit radius of electron (distance from central axis)
r0 . . . initial orbit radius of electron
V1 . . . first electrode (incident side electrode)
V2 . . . third electrode (intermediate electrode)
V3 . . . fourth electrode (projection side electrode)
V4 . . . second electrode (orbit control electrode)

BEST MODE FOR CARRYING OUT THE INVENTION

One embodiment of a deceleration type electrostatic lens A for charged particle radiation of the present invention is described below referring to the drawings.

Figure 1:
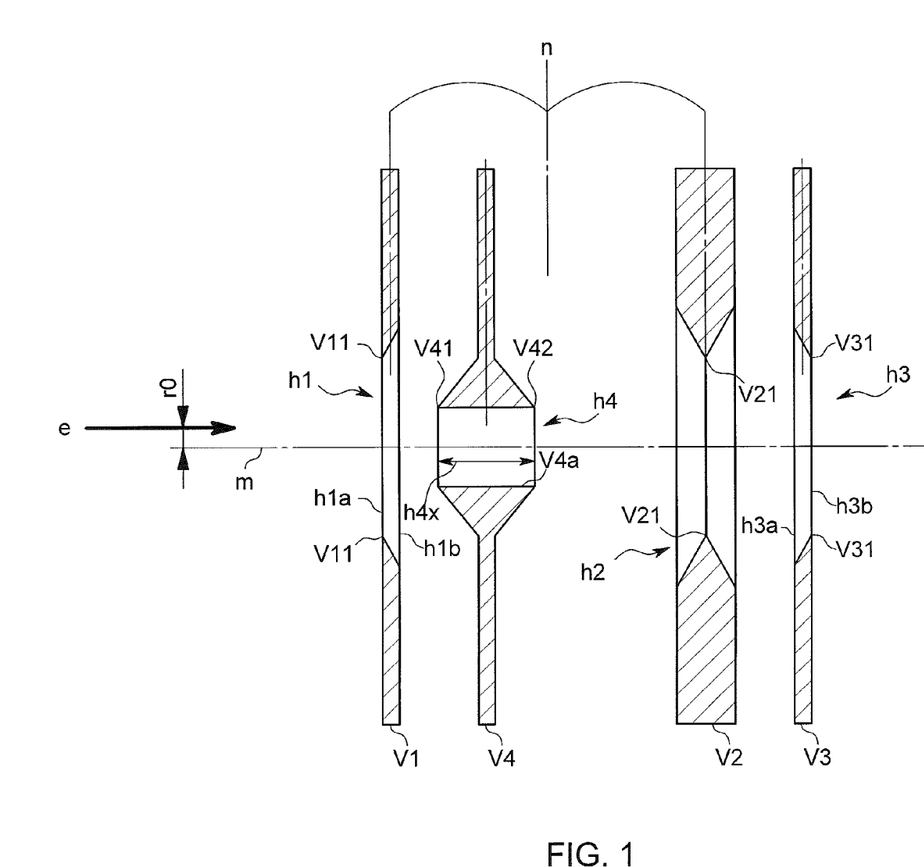
FIG. 1 is a model configuration sectional view of a deceleration type electrostatic lens for electrons according to one embodiment of the present invention.

The deceleration type electrostatic lens A for charged particle radiation according to the present embodiment is for use in an optical system such as, e.g., a scanning electron microscope (SEM) and the like, and is constructed to have a plurality of (four) generally annular-shaped electrodes V1 to V4 having through holes h1 to h4 (which may be generically represented by "through hole h" hereinafter), respectively, which are formed at center portions thereof for passing electrons e serving as charged particles of negative electric charges, wherein the electrodes V1 to V4 are coaxially spaced from each other with their central axes m coincided with each other as shown in FIG. 1.

Three of these electrodes V1 to V4, i.e., an incident side electrode V1, an intermediate electrode V2 and a projection side electrode V3 constitutes a deceleration type three-electrode unipotential lens with the incident side electrode V1 and the projection side electrode V3 maintained at a reference potential (e.g., a ground potential) and the intermediate electrode V2 maintained at a negative potential which is lower than the reference potential, and the three electrode V1 to V3 are essential components of the present electrostatic lens A.

Thus, the features of the present electrostatic lens A, although to be described later, reside in that an orbit control electrode V4 maintained at a higher potential than that of the incident side electrode is arranged between the incident side electrode V1 and the intermediate electrode V2 so as to appropriately control the orbits of the electrons e to reduce a spherical aberration. Therefore, each of the electrodes V1 to V4 for applying an electrostatic field is first explained.

The incident side electrode V1 is constructed such that, for example, a bore diameter of the through hole h1 penetrating the center is gradually expansively opened from an incident side h1a toward a projection side h1b so that an inner circumferential portion in section has a taper shape with a sharp-pointed tip V11 serving as an inner circumference. In the present embodiment, a reference potential is applied to the incident side electrode V1.

The orbit control electrode V4 has a symmetric shape in its thickness direction with the through hole h4 penetrating the center thereof. And an inner circumferential side in section is gradually increased in thickness toward the through hole h4 and an incident side inner circumference V41 and a projection side inner circumference V42 are respectively sharpened (also, referred to as "generally trapezoidal in section" hereinafter). Moreover, in the present embodiment, a bore diameter of the through hole h4 of the orbit control electrode V4 is made smaller than those of the through holes h1 to h3 of the other electrodes V1 to V3 and a length h4x of the through hole h4 in the central axis direction is made extremely larger than the lengths of the through holes h1 to h3 in the central axis direction. In addition, the orbit control electrode V4 is arranged nearer to the incident side electrode V1 than an intermediate position n between the incident side electrode V1 and the intermediate electrode V2. And a positive potential is applied to the orbit control electrode V4.

The intermediate electrode V2 has a symmetric shape in its thickness direction with the through hole h2 penetrating the center thereof. And an inner circumferential side in section is gradually decreased in thickness toward the through hole h2 so that an inner circumference V21 is sharpened. And a negative potential is applied to the intermediate electrode V2.

The projection side electrode V3 is constructed such that a bore diameter of the through hole h3 penetrating the center is gradually expansively opened from a projection side h3b toward an incident side h3a so that an inner circumferential portion in section has a taper shape with a sharp-pointed tip V31 serving as an inner circumference. In the present embodiment, a reference potential equal to that of the incident side electrode V1 is applied to the projection side electrode V3.

Figure 3:
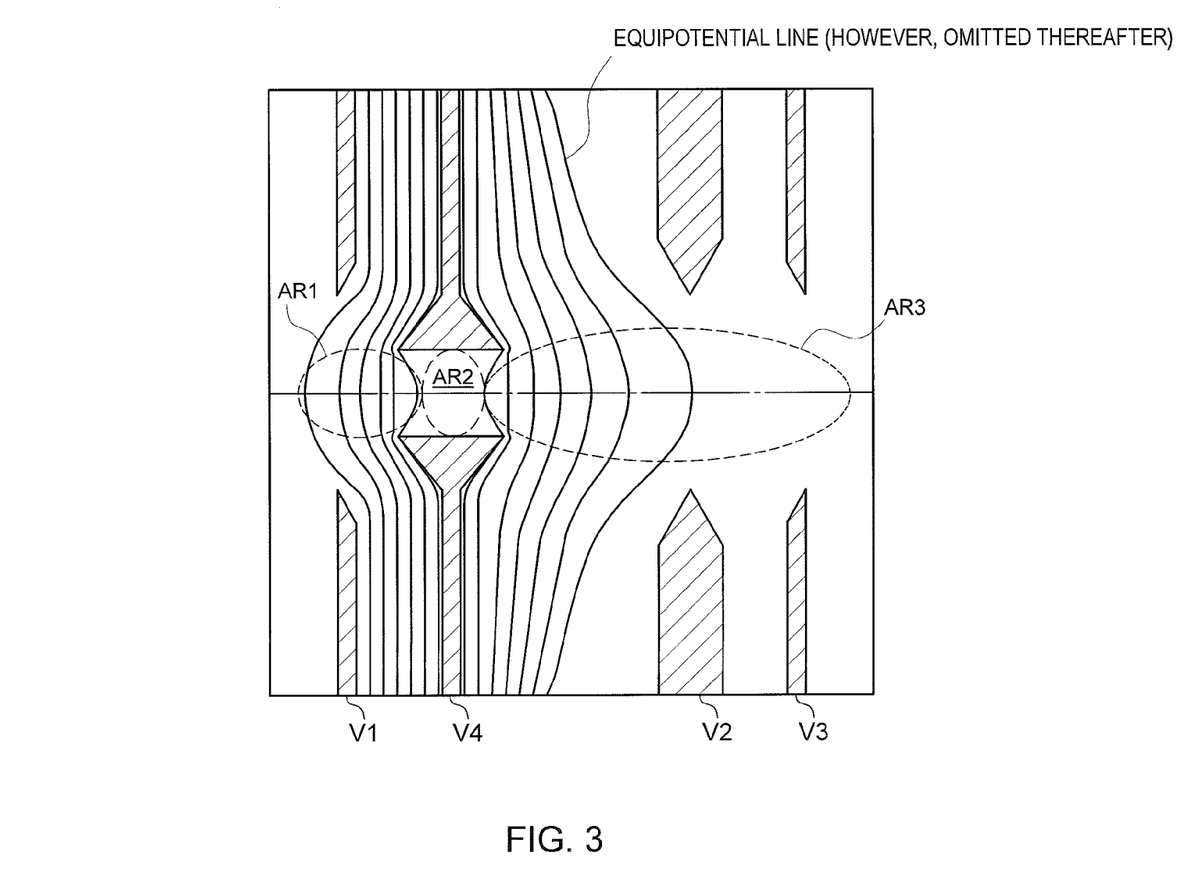
FIG. 3 is a diagram showing equipotential lines caused by an electrode of the same embodiment.

An operation of the deceleration type electrostatic lens A configured as described above is explained. First, when a voltage is applied to each of the electrodes V1 to V4, electric fields represented by, for example, equipotential lines are formed as shown in FIG. 3. In specific, a first electric field area AR1 and a second electric field area AR2 are formed by the two electrodes on the incident side, i.e., by the incident side electrode V1 and the orbit control electrode V4 among these electrodes, wherein the first electric field area AR1 reduces the orbit radius of the electrons e without exceeding, on the way, the initial orbit radius that is the orbit radius at the incident time and the second electric field area AR2 applies a force to the electrons e having passed through the first electric field area AR1 in an advancing direction in parallel with the central axis m.

Figure 2:
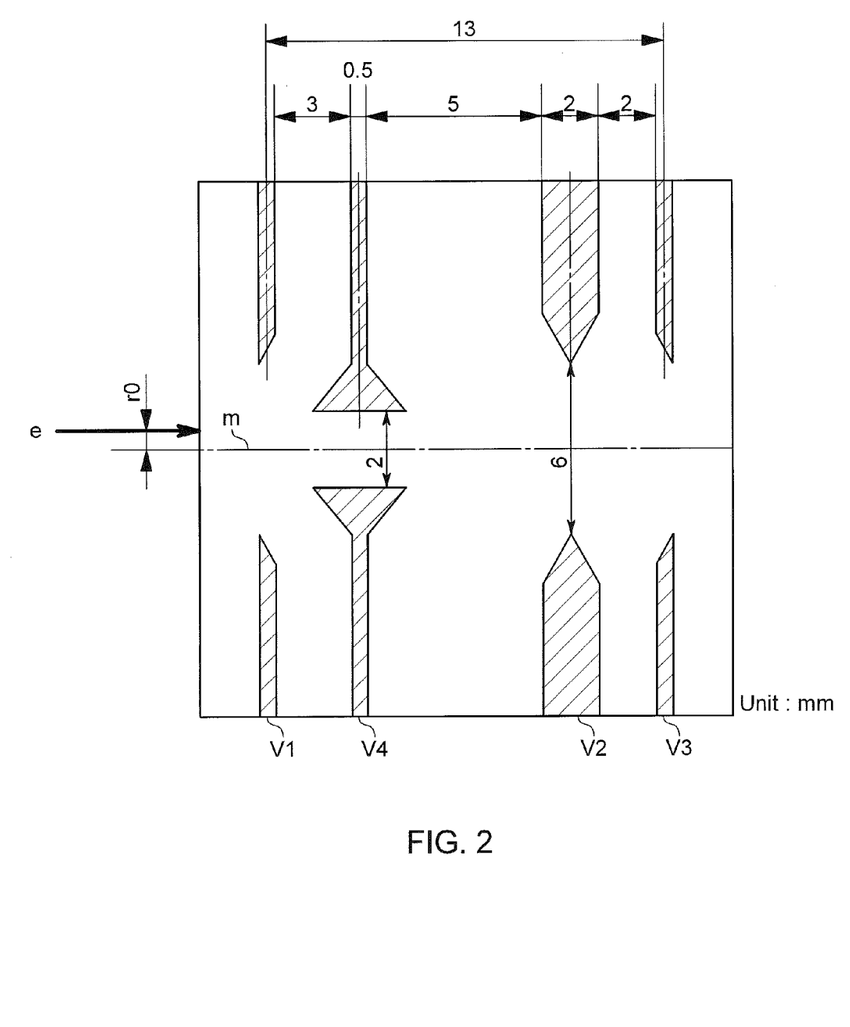
FIG. 2 is a diagram showing a simulation model (embodiment) for verifying an effect of the same embodiment.

Further, a third electric field area AR3 is formed by the two electrodes on the projection side, i.e., by the intermediate electrode V2 and the projection side electrode V3 among the electrodes mentioned above, so that the third electric field area AR3 curves the orbits of the electrons e keeping the orbit radius of the electrons e from exceeding the initial orbit radius on the way and renders the electrons e intersecting with the central axis m at angles larger than advancing angles with respect to the central axis m at a time of being projected from the second electric field area AR2. The electric fields in FIG. 3 are obtained from a model (FIG. 2) as to be described later.

Under this condition, the electrons e are inputted to the incident side electrode V1 from a position at a distance (i.e., initial orbit radius) of r0 from the central axis m in parallel with the central axis m. When the incident electrons e pass through the through hole h1 and advance toward the orbit control electrode V4, the electrons e are affected by a diagonal acceleration electric field in the first electric field area AR1 so that the orbits thereof are curved inward and introduced to the through hole h4 of the orbit control electrode V4 in a direction closer to the central axis m, i.e., in a converging direction. It is noted here that the electric field is set so that the orbit radius (r1) of the electrons e at the time of introducing to the through hole h4 of the orbit control electrode V4 becomes 45 to 60% of the initial orbit radius (r0).

Meanwhile, within the through hole h4 of the orbit control electrode V4, the second electric field area AR2 (also, referred to as "paralleling electric field" hereinafter) is formed in the vicinity of the first electric field area AR1, wherein the second electric field area AR2 serves as a paralleling electric field for paralleling the orbits of the electrons e with respect to the central axis m. Thus, the electrons e from the first electric field area AR1 are being gradually curved in a direction closer in parallel to the central axis m and advanced in a vicinity of a boundary to the second electric field area AR2 or in an area slightly entered the second electric field area AR2, as apparent from FIG. 4. Then, in a central area of the second electric field area AR2, the influences on the electric field from the electric field areas AR1 and AR3 back and forth thereof are substantially precluded to form an electric field area having an extremely small potential gradient as apparent from FIG. 4, and therefore, in this electric field area, the electrons e are substantially not acted upon by a force in any direction of dispersion or convergence, and the electrons e advance as they are. In the present embodiment, the orbits become generally in parallel with the central axis m at the end of the paralleling electric field.

Figure 4:
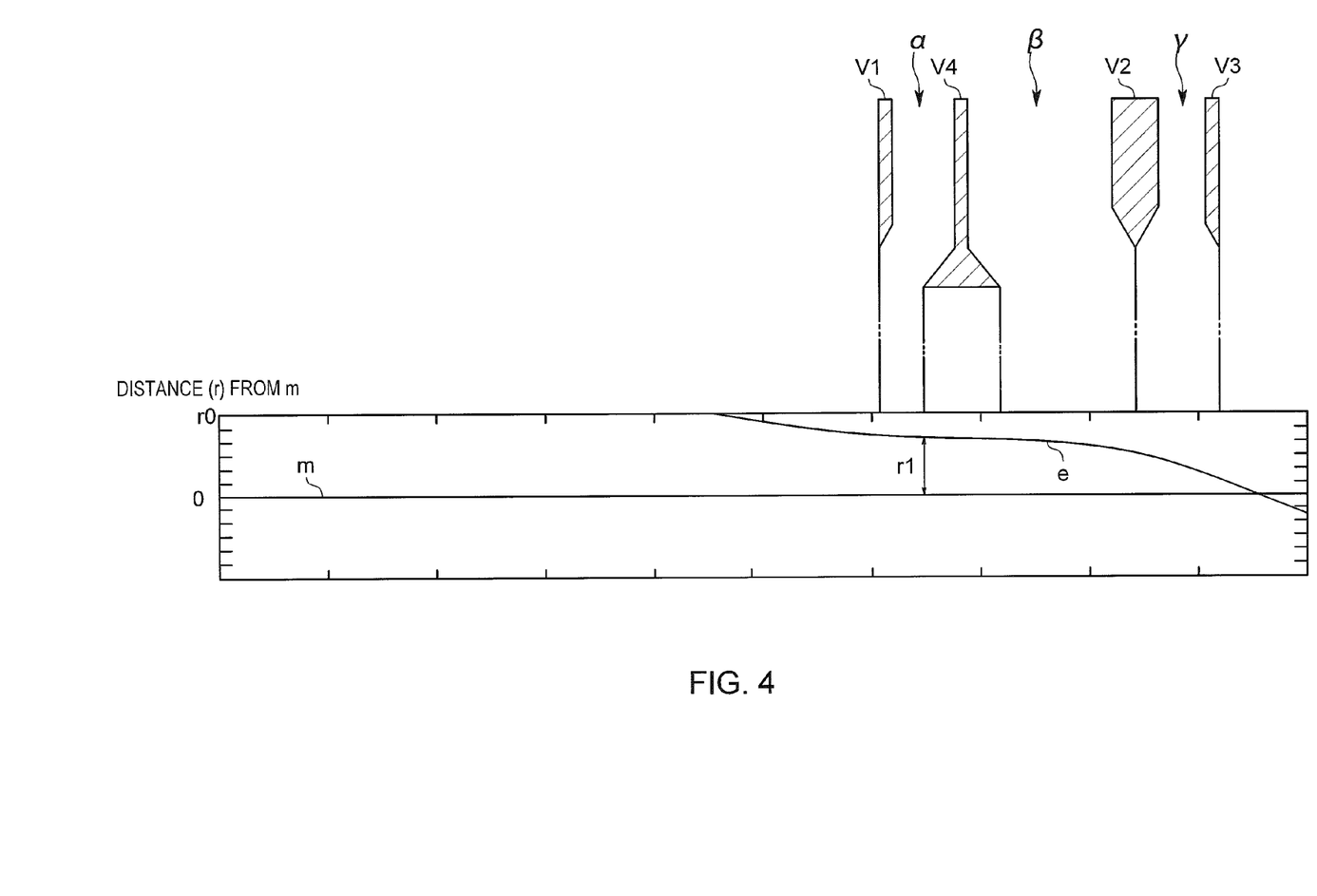
FIG. 4 is a diagram showing an orbit of an electron of the same embodiment.

The electrons e having got out of the paralleling electric field in this manner enter the third electric field area AR3 adjacent to the second electric field area AR2. In a region from the orbit control electrode V4 to the intermediate electrode V2 in this third electric field area AR3, since a deceleration electric field having a slightly diagonal dispersion action is initially formed, the electrons e are affected by a force from this electric field and slightly dispersed, and thereafter advanced toward the central axis m while being sharply curved by an influence of the diagonal acceleration electric field in a region from the intermediate electrode V2 to the projection side electrode V3 and then focused at a focal point on the central axis m.

Therefore, according to the configuration like this, since the orbits in the final stage contributing to the convergence, i.e., when the electrons e pass through the third electric field AR3 is so defined as to set a distance (r) from the central axis m thereof to be smaller than the distance (r0) from the central axis m at the initial incident time of the electrons e, r in Equation (1) is prevented from exceeding r0 and the spherical aberration coefficient Cs can be reduced.

Also, it is adapted to have a configuration such that, after the orbits of the electrons e have been directed in parallel or nearly in parallel with the central axis m, the orbits are curved to the converging direction by the third electric field area AR3 so as to intersect with the central axis m at angles larger than those of the orbits by the paralleling electric field, whereby the lens center is moved to a focal point side compared to a case where the electrons e do not advance in the paralleling electric field, and therefore the focal length F can be made small, and as apparent from Equation (1), the reduction of the spherical aberration coefficient Cs can be promoted also in view of this point. In addition, the resolution can be also improved in view of this point.

Further, this results in improvement of the lens performance such that, if the spherical aberration coefficient is reduced, a chromatic aberration coefficient per se is reduced.

The possibly earliest suppression of a dispersion electric field formed on the way of the present lens A as well as the efficient formation of the paralleling electric field contributes to reduction of the aberration coefficient Cs. That is, regarding each of the electrodes V1 to V4, by defining the shape thereof (in a point that the orbit control electrode V4 is shaped to be trapezoidal in section and the inner circumferences of the other electrodes V1 to V3 are sharpened, and a point of the bore diameters being different, etc.) and defining the intervals (for example, in a point that the distance between the orbit control electrode V4 and the intermediate electrode V2 is made larger than the distance between the incident side electrode V1 and the orbit control electrode V4, etc.) and by setting the potentials thereof, for example, the electric field influences by the incident side electrode V1 and the intermediate electrode V2 on the paralleling electric field formed in the space within the inner circumference of the orbit control electrode V4 are reduced as soon as possible, and therefore the maximization of the second electric field area AR2 and the resultant efficient paralleling of the orbits of the charged particles therefrom can be promoted. Moreover, since the potential gradient of the dispersion electric field formed in a first half of the third electric field area AR3 is reduced and the directions of the equipotential lines are made as perpendicular to the central axis m as possible and the like, the dispersing action to the electrons e can be reduce.

Thus, according to the present electrostatic lens A, a remarkable reduction in aberration of the lens can be realized without causing increase in size and complication, so that it becomes possible to provide a practical deceleration type electrostatic lens A for electrons with a lens performance relatively comparable to that of a magnetic type lens.

In order to verify an effect of the deceleration type electrostatic lens A of the present embodiment, a simulation was executed comparing an example with a comparative example shown as follows.

(1) Regarding Example and Comparative Example

An example and a comparative example used in the simulation are shown as below. Herein, the orbits of the electrons e are assumed to be incident in parallel with the lens axis (central axis m) keeping a distance r0 therefrom. Regarding the orbits of the electrons, a paraxial electron trajectory equation is led from Laplace equation and the resultant equation is computer-calculated using Munro software to obtain the orbits.

Example

Figure 10:
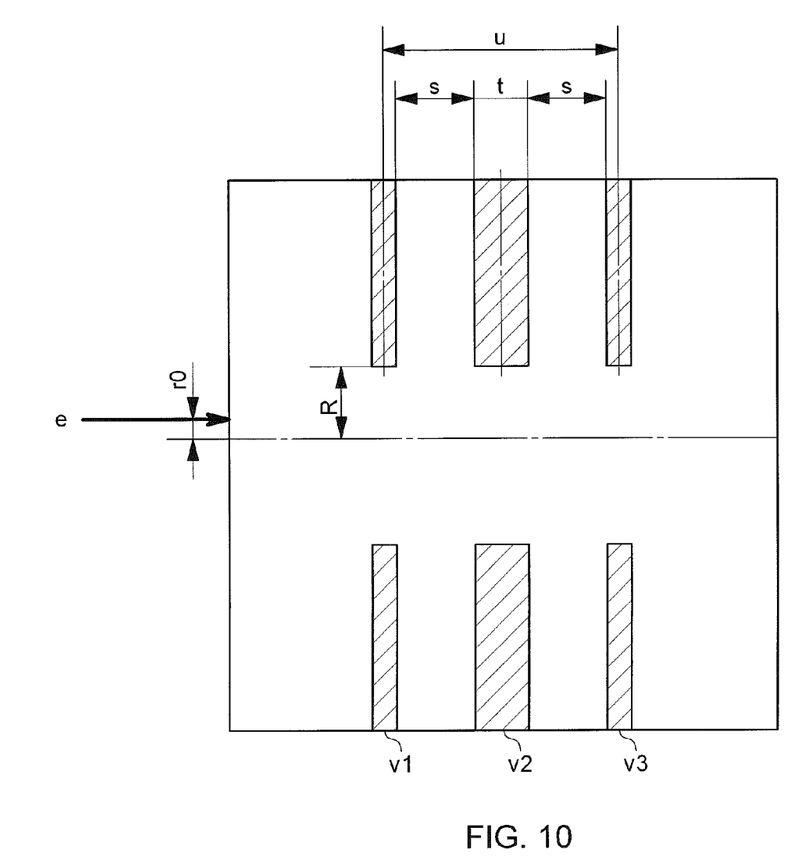
FIG. 10 is a diagram showing a simulation model (comparative example) for verifying an effect of a conventional deceleration type electrostatic lens.
Figure 11:
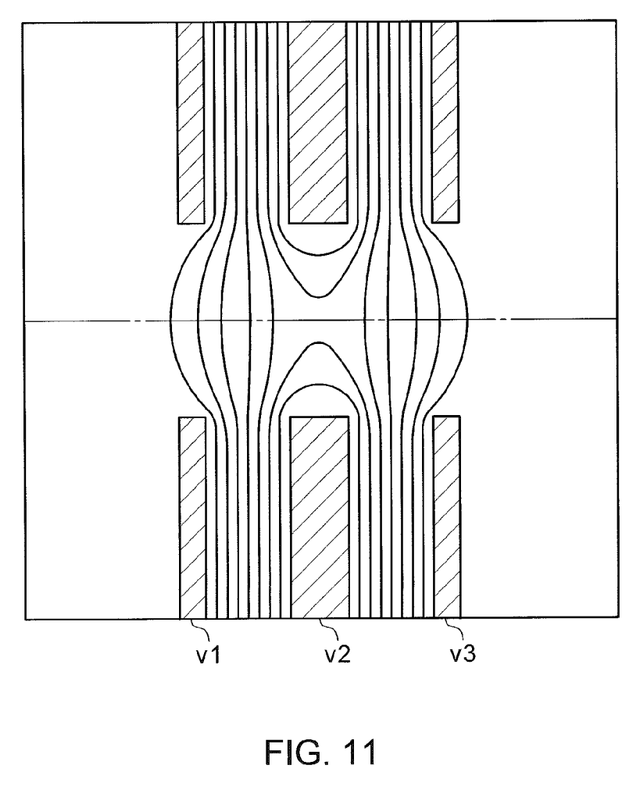
FIG. 11 is a diagram showing equipotential lines caused by an electrode in the same comparative example.
Figure 12:
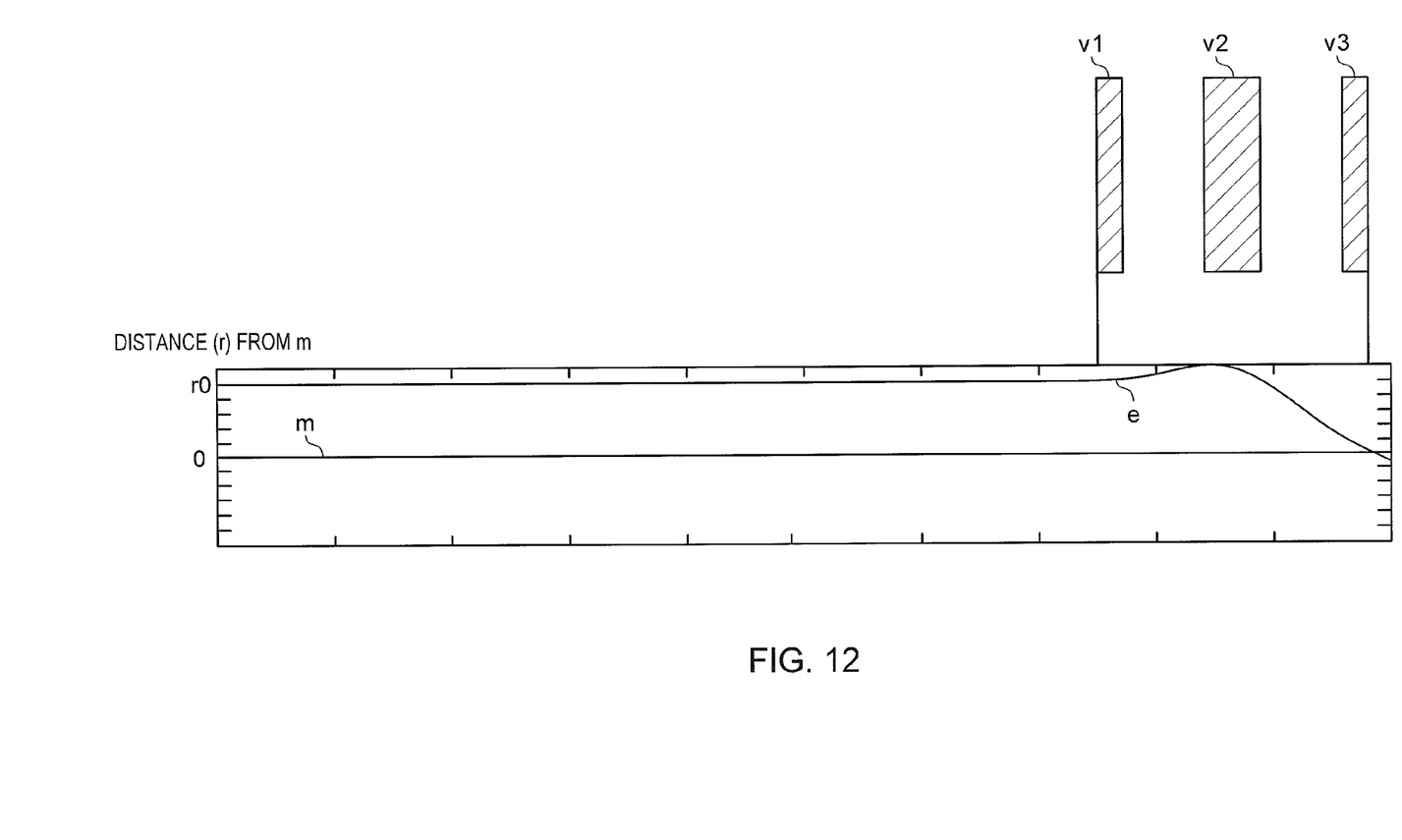
FIG. 12 is a diagram showing an orbit of an electron in the same comparative example.

Configuration: With the configuration shown in FIG. 2, and the potentials to be applied to the respective electrodes are as below:
  Accelerating voltage . . . 5.0 kV
  Incident side electrode V1 . . . 5.0 kV
  Orbit control electrode V4 . . . 15.8 kV
  Intermediate electrode V2 . . . −2.47 kV
  Projection side electrode V3 . . . 5.0 kV
  Distance between incident side electrode V1 and orbit control electrode V4: 3 mm
  Thickness of orbit control electrode V4: 0.5 mm
  Distance between orbit control electrode V4 and intermediate electrode V2: 5 mm
  Thickness of intermediate electrode V2: 2.0 mm
  Distance between intermediate electrode V2 and projection side electrode V3: 2 mm
  Center distance between incident side electrode V1 and projection side electrode V3: 13 mm
  Bore diameter of orbit control electrode V4: 2 mm
  Bore diameter of intermediate electrode V2: 6 mm Comparative Example Configuration: With the configuration shown in FIG. 10, and the potentials to be applied to the respective electrodes are as below:
  Accelerating voltage . . . 5.0 kV
  Incident side electrode V1 . . . 5.0 kV
  Intermediate electrode V2 . . . −5.555 kV
  Projection side electrode V3 . . . 5.0 kV
  Center distance u between incident side electrode V1 and projection side electrode V3: 7.0 mm
  Bore diameter (2R) of each through hole h: 5 mm
  Inter-electrode distance s: 2.0 mm
  Thickness of intermediate electrode V2 t: 2.0 mm (2) Simulation Result and Consideration (2-1) Simulation Result of Example
According to the arrangement of the electrodes shown in FIG. 2, the electric fields shown in FIG. 3 are obtained.
The electrons passing through these electric fields trace the orbits shown in FIG. 4. At this time, the spherical aberration coefficient Cs is 6.177 mm.
(2-2) Simulation Result of Comparative Example
According to the arrangement of the electrodes shown in FIG. 10, electric fields shown in FIG. 11 are formed.
The electrons passing through the electric fields shown in FIG. 11 trace the orbits shown in FIG. 12. At this time, the spherical aberration coefficient Cs is 38.72 mm.
(2-3) Consideration
The value of the spherical aberration coefficient (6.177) of the example could be reduced to nearly 0.16 times the value of the spherical aberration coefficient (38.72) of the comparative example and it could be made apparent to be able to bring the value remarkably close to the value of the spherical aberration coefficient (4.3) of the magnetic type lens as described in the Background Art. Accordingly, it was confirmed that the aberration performance of the lens can be improved by controlling the orbits of the electrons e and that it is possible to provide a deceleration type electrostatic lens A with a lens performance relatively comparable to that of a magnetic type lens.

It is noted that the present invention should not be limited to the embodiment mentioned above.

In the following description, it is noted that the same symbols are added to those corresponding to the embodiment mentioned above.

For example, although the inner circumference V21 of the intermediate electrode V2 has a sharpened shape, it may also be a flat circumferential surface extending in the central axis. Moreover, although the orbit control electrode V4 is arranged nearer to the incident side electrode V1 than an intermediate position n, it may be arranged on the intermediate position n.

Figure 5:
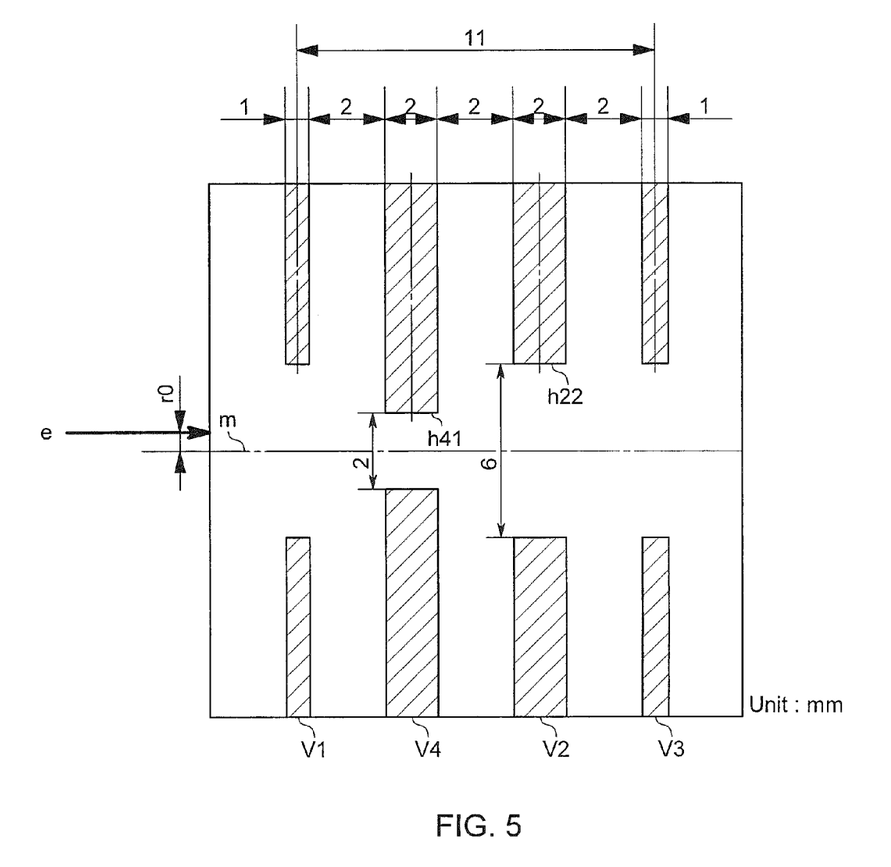
FIG. 5 is a diagram showing a simulation model for verifying an effect of a deceleration type electrostatic lens for electron radiation according to another embodiment of the present invention.

In order to confirm these effects, a simulation model of another example shown in FIG. 5 was created and a simulation similar to that mentioned above was executed.

Figure 6:
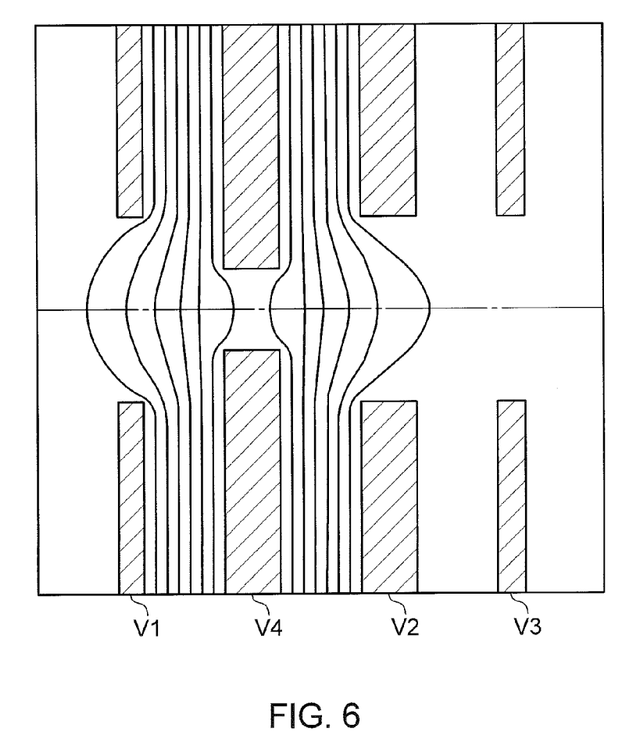
FIG. 6 is a diagram showing equipotential lines caused by an electrode in the same model.

The conditions of applying the potentials to the respective electrodes are as below:
  Accelerating voltage . . . 5.0 kV
  Incident side electrode V1 . . . 5.0 kV
  Orbit control electrode V4 . . . 10.0 kV
  Intermediate electrode V2 . . . −1.72 kV
  Projection side electrode V3 . . . 5.0 kV
  Thickness of incident side electrode V1: 1 mm
  Distance between incident side electrode V1 and orbit control electrode V4: 2 mm
  Thickness of orbit control electrode V4: 2 mm
  Distance between orbit control electrode V4 and intermediate electrode V2: 2 mm
  Thickness of intermediate electrode V2: 2.0 mm
  Distance between intermediate electrode V2 and projection side electrode V3: 2 mm
  Center distance between incident side electrode V1 and projection side electrode V3: 11 mm
  Bore diameter of orbit control electrode V4: 2 mm
  Bore diameter of intermediate electrode V2: 6 mm According to the arrangement of the electrodes shown in FIG. 5, the electric fields shown in FIG. 6 are formed.

Figure 7:
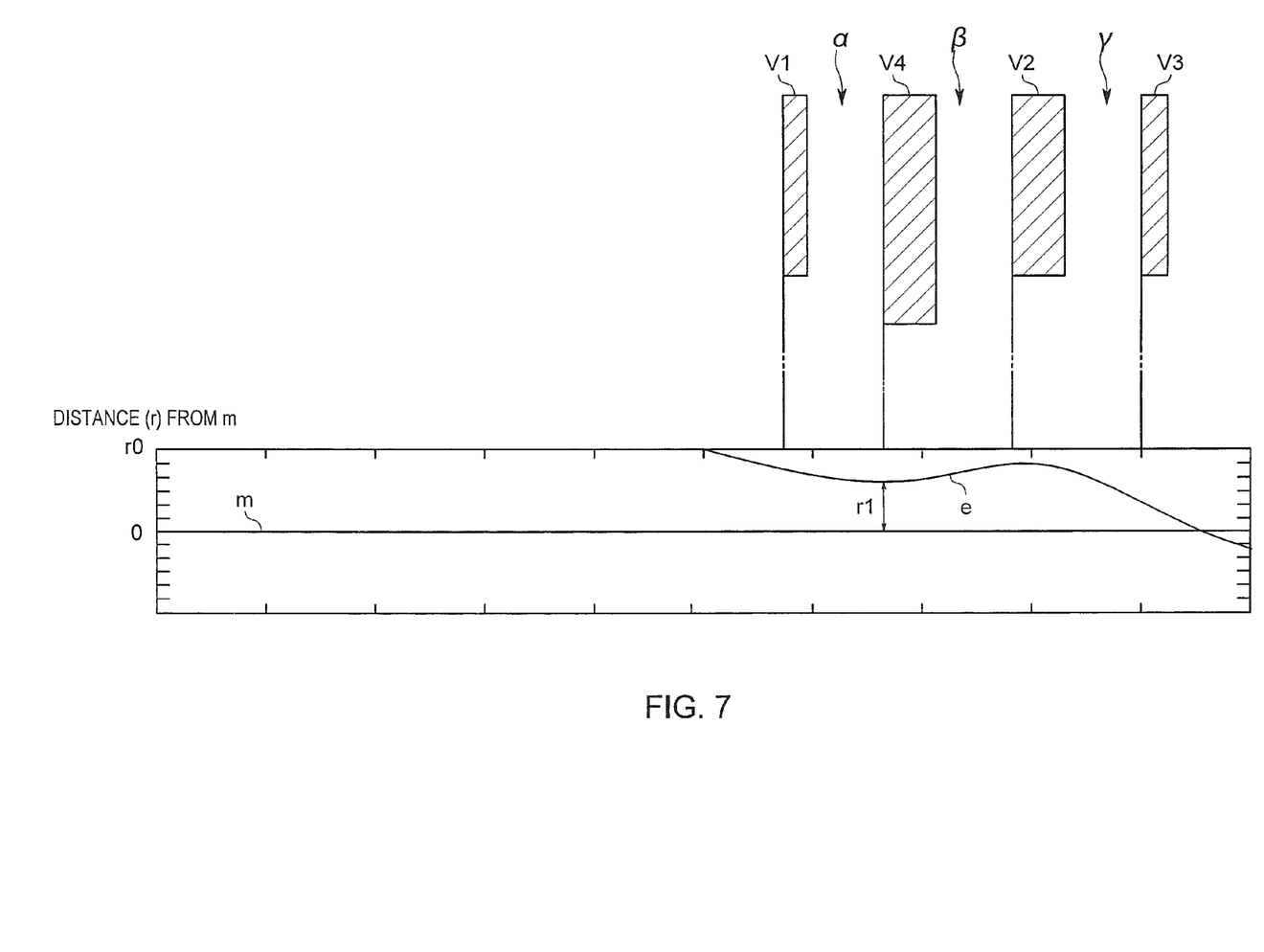
FIG. 7 is a diagram showing an orbit of an electron in the same model.
Figure 8:
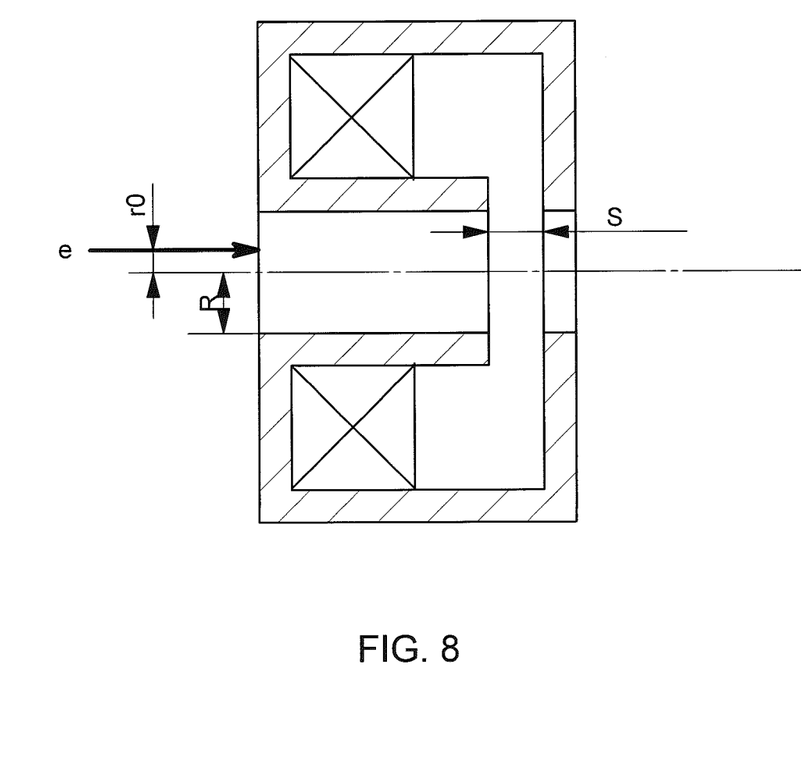
FIG. 8 is a model configuration sectional view of a conventional magnetic type lens.

The electrons passing through these electric fields trace the orbits shown in FIG. 7. At this time, the spherical aberration coefficient Cs is 21.43 mm.

The value of the spherical aberration coefficient (21.43) of this example could be reduced to nearly 0.55 times the value of the spherical aberration coefficient (38.72) of the comparative example and it could be made apparent to be able to bring the value remarkably close to the value of the spherical aberration coefficient (4.3) of the magnetic type lens as described in the Background Art. Accordingly, it was confirmed that the aberration of the lens can be reduced by controlling the orbits of the electrons e and that it is possible to provide a deceleration type electrostatic lens A with a lens performance relatively comparable to that of a magnetic type lens.

It may be used as an objective lens of a SEM or a TEM using the charged particles as electrons, and the other charged particles (e.g., positive ion and negative ion) can be also used. For example, in case of positive ions, the respective electrodes are supplied with voltages of which positive and negative signs are opposite to those of the above embodiment so that the lens can be also used for a scanning type ion microscope and the like. Also, it can be adapted to a micro-focus type X-ray tube.

Figure 13:
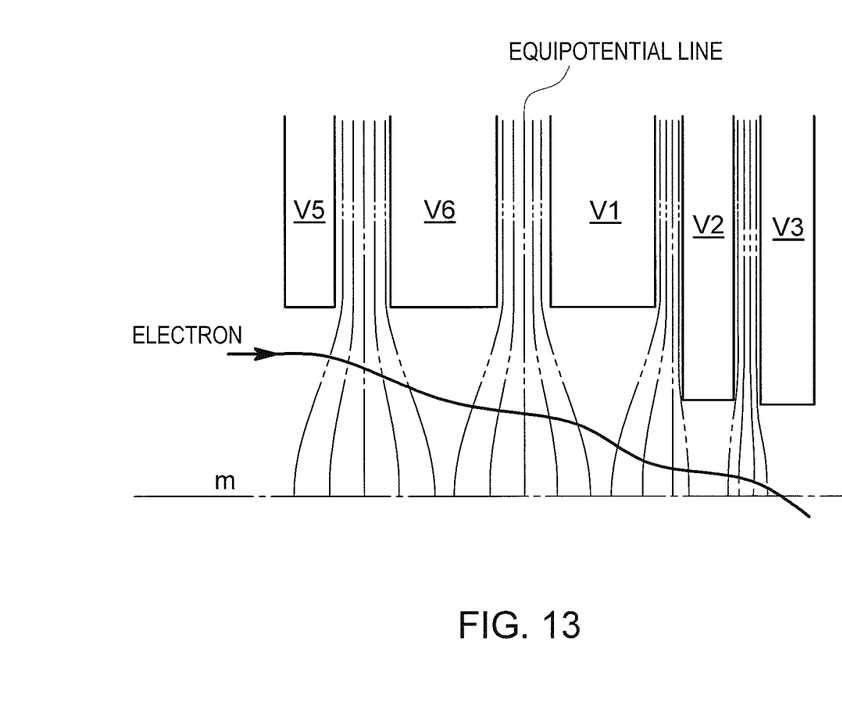
FIG. 13 is a model configuration sectional view of an acceleration type electrostatic lens according to further another embodiment of the present invention.

Further, the present invention can be also adapted to an acceleration type electrostatic lens. In this case, as shown in FIG. 13, a first stage electrode V5 and a second stage electrode V6 of a high potential higher than that of the first stage electrode V5 are arranged in the order from the incident side of the charged particles (electrons) to thereby form the first electric field area and the second electric field area, and further rearward these first and second stage electrodes, an incident side electrode V1 of a low potential lower than that of the second stage electrode, an intermediate electrode V2 of a high potential higher than that of the incident side electrode V1 and a projection side electrode V3 of a low potential lower than that of the intermediate electrode V2 are arranged in this order to thereby form a three-electrode unipotential acceleration type electrostatic lens, whereby the third electric field area may be formed by the three electrode acceleration type electrostatic lens.

With this configuration, since the electron orbits are inclined by the first and second stage electrodes V5 and V6 (first and second electric fields) so that the electrons can be inputted to the rear stage three-electrode acceleration type electrostatic lens at a predetermined angle, the voltages in a degree of five times the acceleration voltage that were said to be necessarily applied to the electrodes can be reduced to be at least in a degree of one-half. Thus, a problem such as a withstand voltage can be solved and this kind of acceleration type electrostatic lens can be used for not only conventional delivery electrodes but also an objective lens of SEM and the like.

Additionally, the present invention should not be limited to the embodiments, and it will be needless to say that various changes within the scope without departing from the intention can be included.

What is claimed is:

1. An electrostatic lens for charged particles provided with a plurality of electrodes arranged on a central axis, each of the electrodes having a through hole for passing through the charged particles, wherein
    among the plurality of electrodes, a plurality of electrodes arranged on an incident side of the charged particles form a first electric field area which reduces an orbit radius of the charged particles without exceeding, on the way, an initial orbit radius that is an orbit radius at an incident time of the charged particles and form a second electric field area which applies a force to advance the charged particles, which have passed through the first electric field area, to a parallel direction with the central axis, and wherein
    among the plurality of electrodes, a plurality of electrodes arranged on a projection side form a third electric field area which keeps the orbit radius of the charged particles not to exceed the initial orbit radius on the way and curves the orbits of the charged particles to intersect with the central axis at angles larger than orbit angles of the charged particles defined with respect to the central axis at a time of being projected from the second electric field area.

2. The electrostatic lens for charged particle radiation according to claim 1, wherein the charged particles incident in parallel with the central axis are advanced substantially in parallel with the central axis in the second electric field area.

3. The electrostatic lens for charged particle radiation according to claim 2, wherein the orbit radius of the charged particles in the second electric field area is approximately 45% to 60% of the initial orbit radius.

4. The electrostatic lens for charged particle radiation according to claim 1, wherein each of the electric field areas is formed by setting at least any of a shape of each electrode, a distance between the electrodes or an application voltage to each of the electrodes.

5. The electrostatic lens for charged particle radiation according to claim 1, wherein an incident side electrode and a projection side electrode are arranged on both sides of an intermediate electrode wherein potentials of the incident side electrode and the projection side electrode are lower than that of the intermediate electrode to form a three-electrode deceleration type electrostatic lens, and an orbit control electrode of a high potential higher than that of the incident side electrode is arranged between the intermediate electrode and the incident side electrode, and wherein
    the first and second electric field areas are formed by the incident side electrode and the orbit control electrode, and the third electric field area is formed by the intermediate electrode and the projection side electrode.

6. The electrostatic lens for charged particle radiation according to claim 5, wherein the orbit control electrode is so formed as to have a shape such that an inner peripheral end thereof has a large thickness larger than that of an outer peripheral side in a direction of the central axis, and
    wherein the intermediate electrode is so formed as to have a shape such that an inner peripheral end thereof has a thin thickness smaller than that of an outer peripheral side in a direction of the central axis.

7. The electrostatic lens for charged particle radiation according to claim 5, wherein a diameter of the through hole formed at a center of the orbit control electrode is made smaller than those of the other three electrodes.

8. The electrostatic lens for charged particle radiation according to claim 5, wherein the orbit control electrode is arranged nearer to the incident side electrode than the intermediate position between the incident side electrode and the intermediate electrode.

9. The electrostatic lens for charged particle radiation according to claim 5, wherein the through hole of the incident side electrode is taper shaped to have its diameter being smaller on the incident side and larger on the projection side.

10. The electrostatic lens for charged particle radiation according to claim 5, wherein the through hole of the projection side electrode is taper shaped to have its diameter being larger on the incident side and smaller on the projection side.

11. The electrostatic lens for charged particle radiation according to claim 1, wherein a first stage electrode and a second stage electrode of a high potential higher than that of the first stage electrode are arranged in the order from the incident side of the charged particles to thereby form the first electric field area and the second electric field area,
    and further rearward these first and second stage electrodes, an incident side electrode of a low potential lower than that of the second stage electrode, an intermediate electrode of a high potential higher than that of the incident side electrode and a projection side electrode of a low potential lower than that of the intermediate electrode are arranged in this order to form a three-electrode acceleration type electrostatic lens, whereby the third electric field area is formed by the three electrode acceleration type electrostatic lens.

* * * * *